United States Patent [19]
Moloney et al.

[11] Patent Number: 5,528,237
[45] Date of Patent: Jun. 18, 1996

[54] PIPELINED DECODER FOR HIGH FREQUENCY OPERATION

[75] Inventors: David Moloney, Cornaredo; Paolo Gadducci, Tirrenia; Giorgio Betti, Milan; Roberto Alini, Stradella, all of Italy

[73] Assignee: SGS-Thomson Microelectronics, SRL, Agrate Brianza, Italy

[21] Appl. No.: 285,918

[22] Filed: Aug. 3, 1994

[30] Foreign Application Priority Data

Sep. 21, 1993 [EP] European Pat. Off. .............. 93830387

[51] Int. Cl.$^6$ .................................................. H03M 7/00
[52] U.S. Cl. .................................................. 341/59; 341/68
[58] Field of Search .............................. 341/55, 59, 61, 341/68, 69

[56] References Cited

U.S. PATENT DOCUMENTS

| | | | |
|---|---|---|---|
| 3,852,687 | 12/1974 | Hodges | 332/11 R |
| 3,996,613 | 12/1976 | Manning et al. | 360/40 |
| 4,323,931 | 4/1982 | Jacoby | 360/40 |
| 4,337,458 | 6/1982 | Cohn et al. | 341/55 |
| 4,451,819 | 5/1984 | Beckenhauer | 341/61 |
| 4,538,189 | 8/1985 | Fitzpatrick | 360/40 |
| 4,833,470 | 5/1989 | Iketani | 341/59 |
| 4,908,721 | 3/1990 | Rub | 360/40 |
| 5,062,011 | 10/1991 | Hase et al. | 360/40 |
| 5,172,359 | 12/1992 | Sato | 369/59 |
| 5,177,482 | 1/1993 | Cideciyan et al. | 341/59 |
| 5,327,124 | 7/1994 | Funamoto | 31/58 |
| 5,617,552 | 10/1986 | Kojima et al. | 341/68 |

FOREIGN PATENT DOCUMENTS 0271317  6/1988  European Pat. Off. ........ G11B 20/14

Primary Examiner—Marc S. Hoff
Attorney, Agent, or Firm—Felsman, Bradley, Gunter & Dillon

[57] ABSTRACT

A decoder for decoding a serial data stream employs an extracted base clock signal, synchronous with an input, coded, serial data stream, a first fractionary frequency clock signal for sampling a decoded output data stream and a second fractionary frequency clock signal for synthesizing a pre-decoded value, produced by a first combinative logic network, within a second combinative logic network to produce a decoded value that is sent to an output sampling flip-flop. In a decoder according to the present invention, a pipelined operation is implemented by momentarily storing the bits (part of the bits handled by the decoder) that are processed in the second combinative logic network and by anticipating of two full cycles of the synchronous base clock signal the processing, by said first combinative network, of the total n-number of bits handled by the decoder. Each one of the two combinative logic networks is permitted to complete its decoding process within a full clock cycle in advance of the rising front of the output sampling clock signal. With the same fabrication technology and therefore with the same propagation delay of the two combinative logic networks, the maximum operating speed may be doubled. A limited number of additional components are required to implement the pipelined operation of the invention.

13 Claims, 6 Drawing Sheets

Decode Table for (1, 7) RLL Code Set

| ENCODED READ DATA | | | DECODED DATA |
|---|---|---|---|
| Previous Y Y 2' 3' | Present Y Y Y 1 2 3 | Next Y Y 1 2 | D D 1 2 |
| 0 0 | 0 0 0 | X X | 0 1 |
| 1 0 | 0 0 0 | X X | 0 0 |
| 0 1 | 0 0 0 | X X | 0 1 |
| X X | 1 0 0 | X X | 1 1 |
| X 0 | 0 1 0 | 0 0 | 1 1 |
| X 0 | 0 1 0 | 1 0 | 1 0 |
| X 0 | 0 1 0 | 0 1 | 1 0 |
| X 1 | 0 1 0 | 0 0 | 0 1 |
| X 1 | 0 1 0 | 1 0 | 0 0 |
| X 1 | 0 1 0 | 0 1 | 0 0 |
| 0 0 | 0 0 1 | X X | 0 1 |
| 1 0 | 0 0 1 | X X | 0 0 |
| 0 1 | 0 0 1 | X X | 0 0 (Preamble) |
| X X | 1 0 1 | X X | 1 0 |

FIG. 1

Encode Table for (1, 7) RLL Code Set

| NRZ DATA | | ENCODED WRITE DATA | |
|---|---|---|---|
| Present D D 1 2 | Next D D 3 4 | Previous Y 3 | Present Y Y Y 1 2 3 |
| 0 0 | 0 X | X | 0 0 1 |
| 0 0 | 1 X | 0 | 0 0 0 |
| 0 0 | 1 X | 1 | 0 1 0 |
| 1 0 | 0 X | 0 | 1 0 1 |
| 1 0 | 1 X | 0 | 0 1 0 |
| 0 1 | 0 0 | 0 | 0 0 1 |
| 0 1 | 0 0 | 1 | 0 1 0 |
| 0 1 | 1 0 | 0 | 0 0 0 |
| 0 1 | 1 0 | 1 | 0 0 0 |
| 0 1 | 0 1 | 0 | 0 0 1 |
| 0 1 | 0 1 | 1 | 0 0 0 |
| 0 1 | 1 1 | 0 | 0 0 0 |
| 0 1 | 1 1 | 1 | 0 0 0 |
| 1 1 | 0 0 | 0 | 0 1 0 |
| 1 1 | 1 0 | 0 | 1 0 0 |
| 1 1 | 0 1 | 0 | 1 0 0 |
| 1 1 | 1 1 | 0 | 1 0 0 |

NOTE: X = Don't Care

FIG. 2

PIPELINED DECODER FOR HIGH FREQUENCY OPERATION

CROSS REFERENCE TO RELATED APPLICATION

This application contains subject matter in common with co-pending application Ser. No. 08/285,842, Attorney Docket No. 93-CA-012, filed on even date herewith, titled RLL/NRZ DECODER PROGRAMMABLE FOR SINGLE/ DUAL BIT OUTPUT DATA STREAMS, by Moloney, et al., and assigned to the assignee hereof. Such co-pending application is hereby expressly incorporated by reference into the present application.

FIELD OF THE INVENTION

The invention generally relates to a decoder for serial data transfer channels, for example from peripherals to a CPU and viceversa. The invention is particularly useful for read/write channels of a mass memory system, such as for example a hard disk system.

BACKGROUND OF THE INVENTION

In mass memory supports, such as for example hard disks, floppy disks, CD, tape streamers and similar devices, digital data are stored by physically recording on the support only the "1", spaced among each other along a magnetic track by segments, the length of which is proportional to the number of "0" present between two successive "1".

Considerations on the dynamic characteristics of revolving or winding supports, impose a minimum distance between adjacent "1". In fact, if any two successive "1" are physically recorded one close to the other on the support, interference between the two recorded "peaks" can cause indetermination and errors during reading due to practical limitations of the discriminating capacity of the reading pick-ups.

Moreover, another peculiarity of these mass storing systems is represented by the fact that the sampling clock signal that is used in the write/read channels circuitry cannot be derived by a system's clock (e.g. by frequency division). Necessarily it has to be a synchronous clock signal that is derived directly from the serial data stream, the "speed" of which may often vary. For example, in the case of a hard disk, data recorded on outer circular tracks may be written and read at a higher speed than data written and read on inner circular tracks. In general, in this as in many other applications, a variable frequency clock signal, synchronous with the serial streams of data, is generated by detecting the succession of transitions of a coded pulse stream that represents a succession of digital data. For example a common phase-locked circuit (PLL), cooperating with a voltage controlled oscillator (VCO), is employed. Where there is the necessity of generating a variable frequency, synchronous time base signal (i.e. synchronous base clock signal), there may be also a practical limit to the maximum "distance" between any two successively recorded "1". Actually, if a transition can occur after an excessively long period of time from a preceding transition, the synchronism of the self-generated clock frequency, "locked" to the pulse stream, can be lost. That could introduce, also in this case, indetermination of the correct sampling instant and therefore errors during reading.

These "dynamic" limitations are commonly overcome by implementing special codification of the data being transferred, capable of ensuring an established minimum number of "0" and an established maximum number of "0" between any successive "1" of a coded binary serial data stream.

Several codifications of this type are known. For example in a so-called Run Length Limited system RLL(2,7), the digits 2 and 7 indicate a minimum number (2) and the maximum number (7), respectively, of "0" between any two "1". In a RLL(1,7) system, the two numbers indicate the minimum number of "0"(in this case 1) and the maximum number of "0" (in this case 7), that may be present between any two successive "1" of a coded binary serial data stream.

Of course, the adoption of a particular coding system of the serial data stream, for example from and to a rotating mass memory support, or also from and to a different type of peripheral having similar dynamic operation characteristics, implies the use of special coding and decoding circuits of the serial stream of digital data.

A common peculiarity of these as well as of other coding/decoding systems is that the "frequency" of the input serial data stream and the "frequency" of the output serial data stream are different. In fact to a certain number X of bits of a decoded serial data, commonly of the so-called NRZ type (an acronym of Non-Return-to-Zero), corresponds a larger number Y of bits of a coded serial data (Y=X+z, z≧1). For example, two bits of a decoded NRZ of data signal may correspond to three bits of the coded data signal. This fact implies that during a reading phase, a certain time base frequency (clock) VCO, must be extracted from the sequence of transitions of the coded signal, for example by means of a PLL circuit. The derived VCO signal, synchronous with the incoming serial stream of coded data is employed as clock signal for controlling a shift register to which the coded signal is fed. From said synchronous clock signal fractionary clock signals must then be derived. Suppose, for example, that the ratio between the equivalent number of bits of the coded serial data and of the decoded serial data is equal to 3:2(1.5). From the base clock signal VCO, derived from the transitions of the coded input signal, are derived two fractionary clock signals. A first fractionary frequency clock signal VCO/1.5 is used for sampling the decoded output signal, and a second fractionary frequency clock signal VCO/3 is employed in the timing and synthesizing functions that are performed by the decoding circuitry of the decoder.

For example, in case of an RLL(1,7) code, the decoding and coding tables are shown in FIGS. 1 and 2, respectively.

A common architecture of a decoder is shown in FIG. 3, while the timing diagrams are shown in FIG. 4.

As shown in FIG. 3, a shift register SR receives the serial stream of coded data, $\overline{\text{SYNDATA}}$, and is synchronized with the extracted base clock signal VCO. It may be provided with a number of flip-flops (FFn) greater than the number of bits handled by the decoder, which for example, in the case shown, is of 7 bits. The flip-flops in excess, relative to the Q0 and Q1 taps of the shift register SR, may be employed for other accessory functions, as is well known to a person skilled in the art. A first combinative logic block RC1 processes the Q outputs of the seven flip-flops Q<2:8>, that is the taps relative to the seven bits handled by the decoder, and produces an output value ND0. That output is fed to a first timing flip-flop A, sampled at the first fractionary frequency clock signal VCO/1.5. The Q output of the flip-flop A is fed to a second combinative logic block RC2, to be combined with the values of the second fractionary frequency clock signal VCO/3 and of a fractionary number of bits (the bits present at the taps Q5, Q6 and Q7 of the respective flip-flops of the shift register SR) of the total number of bits handled by the decoder. The second fractionary frequency clock signal VCO/3 is fed to the second combinative logic block RC2, in order to modify the logic function of the block. As shown in FIG. 3, in this way its output may assume alternatively the value NQ0, as produced by the first combinative block RC1 and timed by the first flip-flop A, or the value produced by RC2 by processing the relative Q5, Q6 and Q7 bits. In practice, RC2 "incorporates" a multiplexer, necessary for bringing to an output stage of the decoder a signal ND1, containing the decoded information, in the form of two decoded bits. The decoded bits are then sampled at the fractionary frequency of the output clock signal VCO/1.5, in order to produce the serial output NRZ data stream. Specifically, a synthesized output value ND 1, produced by the second combinative logic network RC2, is fed to a second output sampling flip-flop B, which is also controlled, as the first flip-flop A, at the first fractionary frequency clock signal VCO/1.5. The output signal of the second flip-flop B represents the decoded NRZ stream having a "frequency" that is different (a fraction thereof) from the "frequency" of the input coded serial data stream.

Generally, the logic functions necessary for decoding (specified in the respective decoding blocks in the figures), are defined as sums of products. They may be implemented with a two-level logic, a first AND level and a successive OR level. In a practical embodiment it is possible to employ two levels of NAND gates because they are notably more efficient in CMOS technology. Of course, logic circuits with more than two levels may also be employed, for implementing different decodings, or for reducing the number of inputs of single logic gates, in case it may become excessively large.

The two decoding combinative logic networks RC1 and RC2 will have a precisely quantifiable delay of propagation, depending on the fabrication technology of the integrated circuit. Such a propagation delay determines the maximum frequency of operation of the decoder. In the example taken into consideration, as visualized in the timing diagrams of FIG. 4, the operative limit of the circuit is given by a maximum "period" corresponding to two times the delay of propagation of the decoding combinative logic networks. This intrinsic speed limit of the circuit derives from the fact that alternatively each of the two combinative logic networks RC1 and RC2 must complete its function (obviously with the propagation delay of the network) within a half-period of the extracted synchronous clock signal VCO. This limiting aspect is indicated by the arrows and labels placed on the timing diagrams of the circuit shown in FIG. 4.

This mechanism of limitation of the maximum operating frequency imposed by the fabrication technology used for realizing the decoding combinative logic networks, is intrinsic to decoders of the type in question, irrespectively of the particular coding that is used.

SUMMARY OF THE INVENTION

An object of the present invention is to provide a way to overcome this limitation of the maximum frequency of operation of a decoder, imposed by the particular fabrication technology that is used, and determined essentially by the delay of propagation through the combinative logic circuits that are employed for decoding.

Another object of the present invention is to double the maximum operating frequency of the decoder for the same fabrication technology used.

This important result is achieved, according to the invention, by an architecture that may be defined as "pipelined". Specific circuit blocks perform parts of a whole logic function, simultaneously, and the partial results (signals) produced by the different blocks, are then "combined" for producing the overall result of the decoding function. In practice, the function of a first combinative logic decoding network is implemented in several steps and the partial results are stored in multiple registers and alternately fed, through a multiplexer, to a second, synthesizing, combinative logic network. The architecture of the decoder is basically conceived so as to re-synchronize and re-synthesize the signals in order to allow the combinative logic networks to carry out and conclude their decoding function, specifically, always within the interval of an entire period of an extracted base clock signal (synchronous with the coded serial stream which is fed to an input shift register). In practice this is obtained by processing the bits stored in the input shift register by a first combinative logic decoding network, two base clock cycles in advance of the processing by a second combinative logic network, which decode a partial number of bits stored in the shift register. And simultaneously, these bits, that will be subsequently processed by the second combinative logic network, are momentarily stored in order to maintain the necessary coherence of the values that eventually are synthesized in the second combinative logic network.

BRIEF DESCRIPTION OF THE DRAWINGS

The different aspects and advantages of the invention will become more evident through the following description of an important embodiment, herein incorporated by express reference, and by referring to the attached drawings, wherein:

FIG. 1 is a decoding table according to an RLL(1,7) code, as already described above;

FIG. 2 is a coding table according to the same protocol RLL(1,7), as already described above;

DESCRIPTION OF THE PREFERRED EMBODIMENTS

According to the invention, in the first place, the value produced by the first combinative logic network is sampled at the frequency of the base clock signal VCO, in order to produce two signals, that are out of phase between each other by half a period of the base clock signal VCO. The pair of signals thus obtained is fed to the respective inputs of a multiplexer. The multiplexer performs a selection, in function of a second fractionary frequency clock signal, having a frequency that is a fraction of the frequency of a first fractionary frequency clock signal. Said first fractionary frequency clock signal has a frequency which is in turn a fraction of the frequency of the synchronous base clock signal VCO, the ratio with the synchronous base clock signal being congruent with the ratio between the corresponding number of bits of the incoming coded serial stream and of the output decoded serial stream. To the input of a first synchronization flip-flop already present in the known structure of the decoder, one and the other of the two signals, out of phase by half period of the VCO clock signal between each other, are alternatively fed. In this way, availability at the input of the first synchronization flip-flop of a pre-decoded ND0 signal is ensured (by the selection of one or the other of the multiplexed signals: ND0' and ND0"), a full cycle of the synchronous VCO clock signal before the relative rising front of the sampling signal of the output serial stream, i.e of the first fractionary frequency clock signal. Therefore, to an input of the second combinative logic decoding network is brought a pre-decoded and synchronized signal that may be coherently combined with the momentarily stored bits and with the second fractionary frequency clock signal. In this way the decoder of the invention allows the performing of a correct synthesization of signals in the second combinative logic network. The output value of said second combinative logic network is then brought to the input of a second sampling flip-flop of the decoded serial signal output by the decoder.

Figure 3:
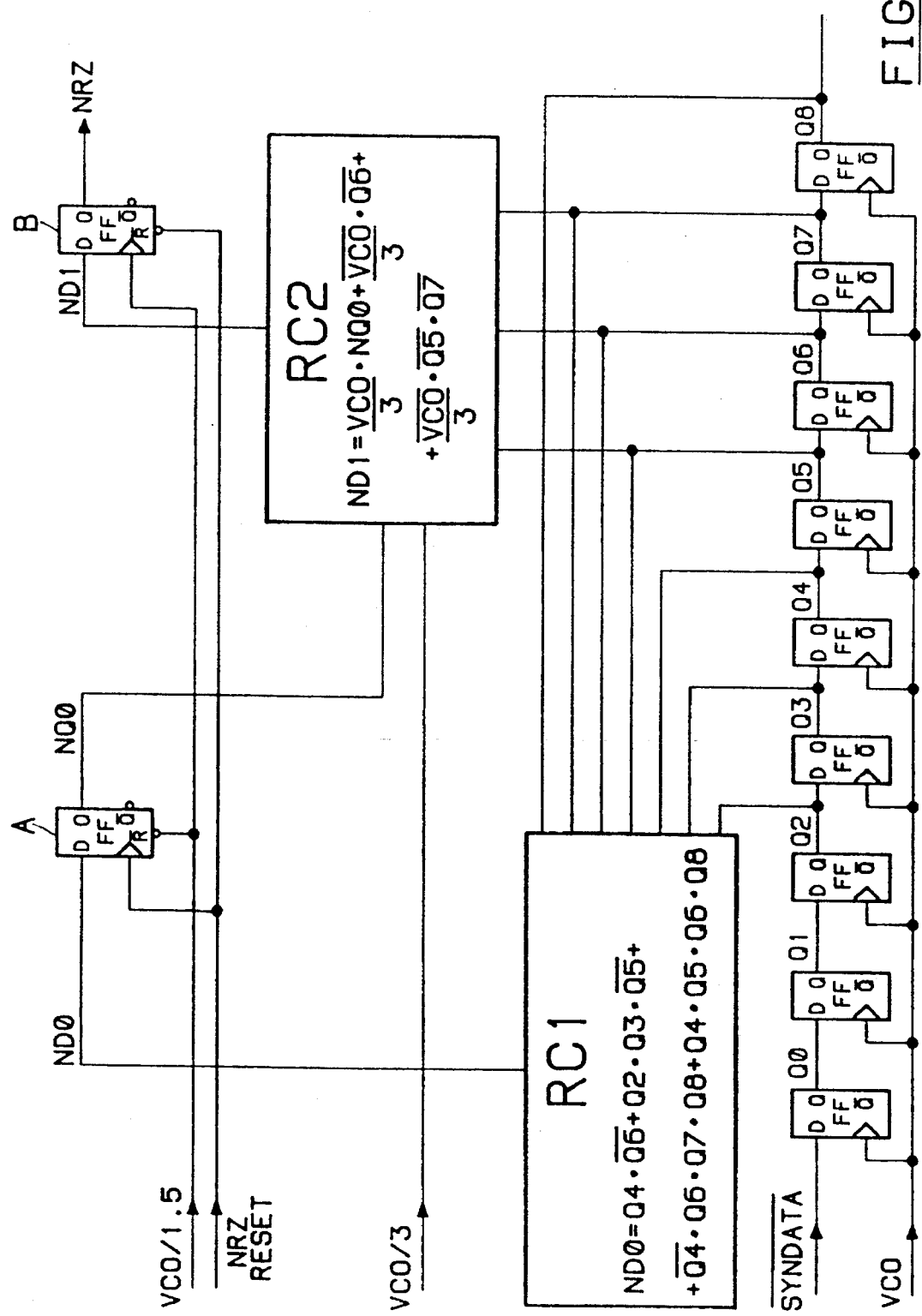
FIGS. 3 and 4 are a block diagram and a time diagram, respectively, of a decoder made according to the prior art, as already described above.
Figure 4:
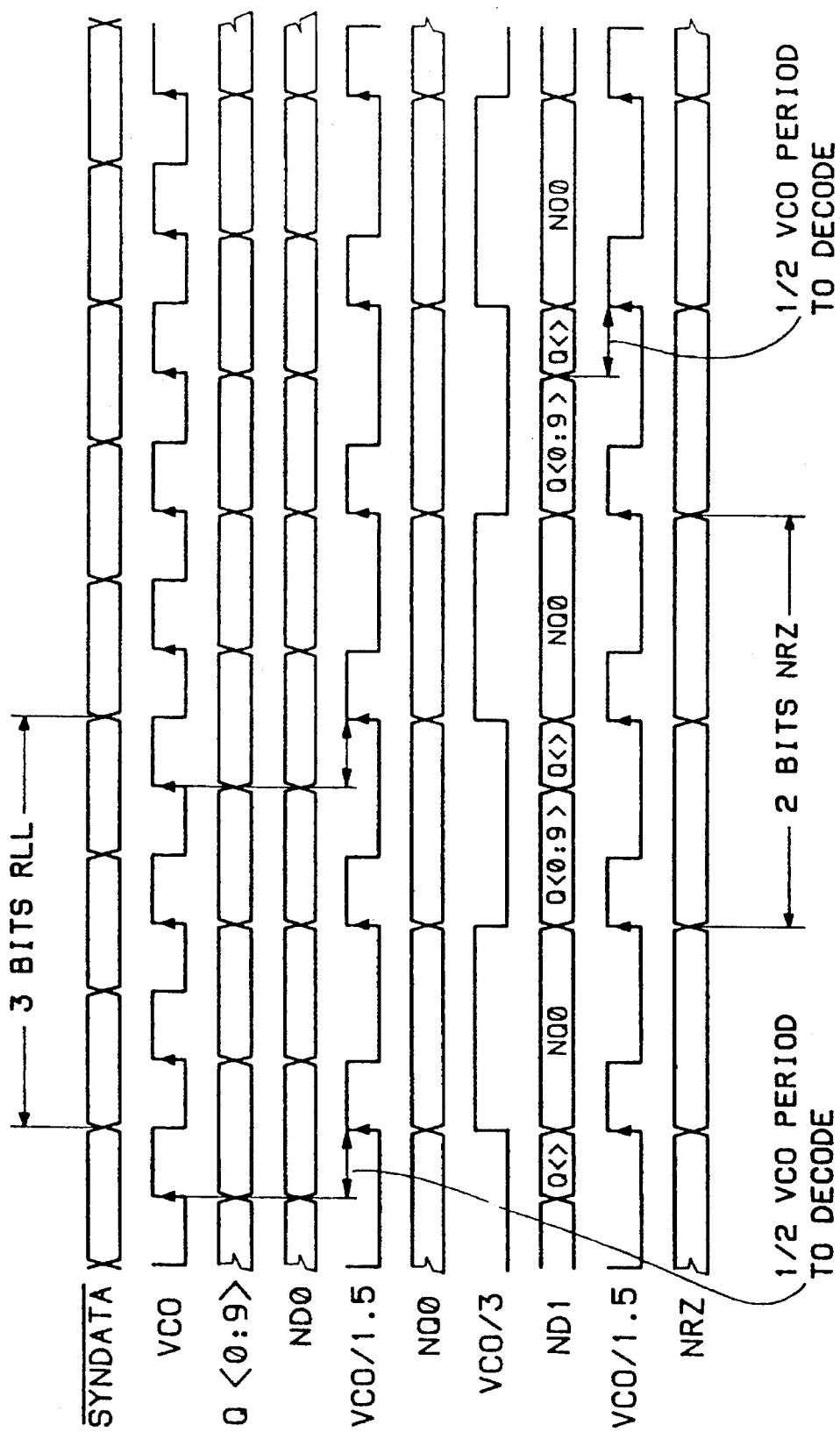
Figure 5:
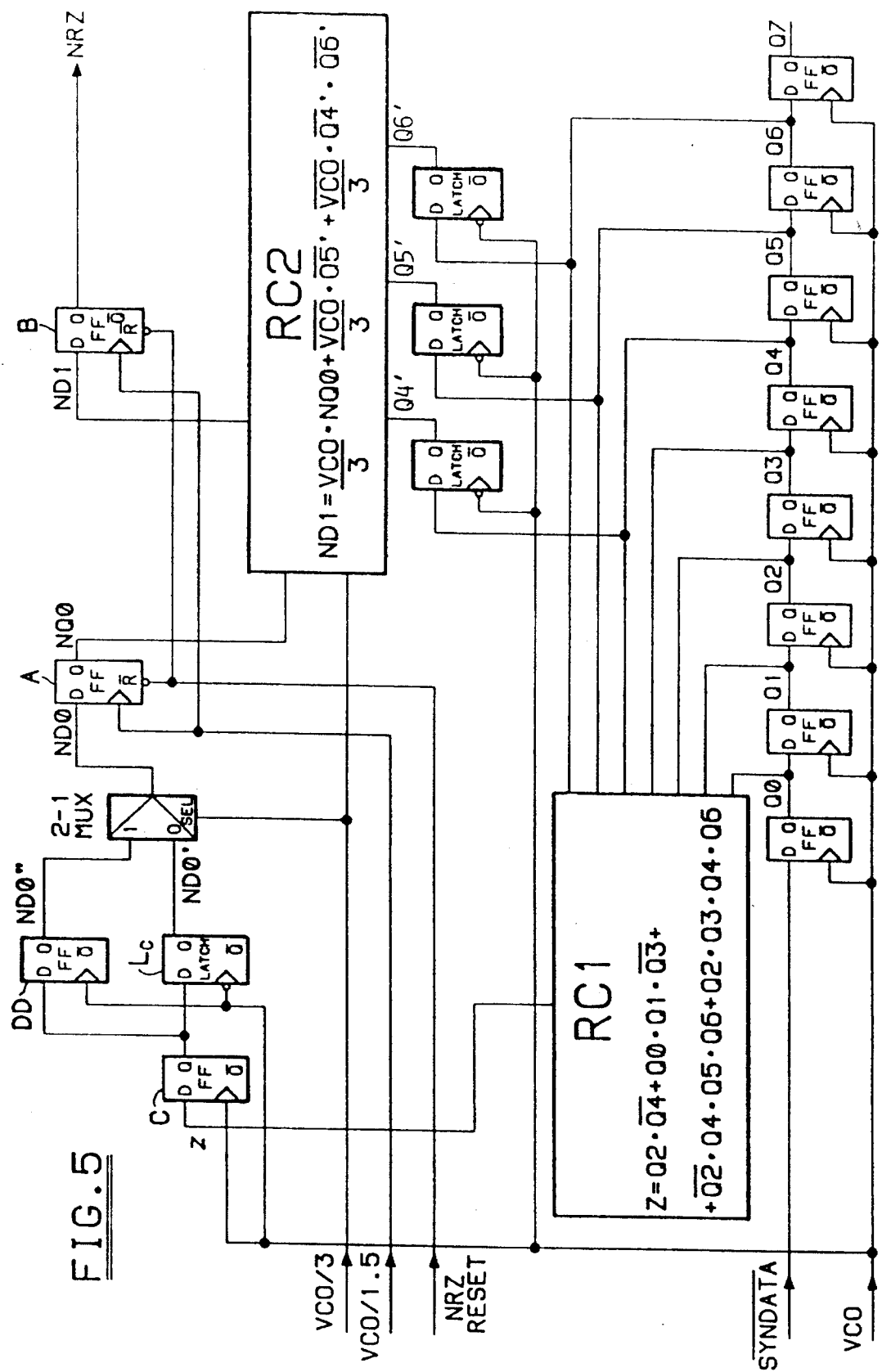
FIG. 5 is a block diagram of a decoder made according to the present invention.
Figure 6:
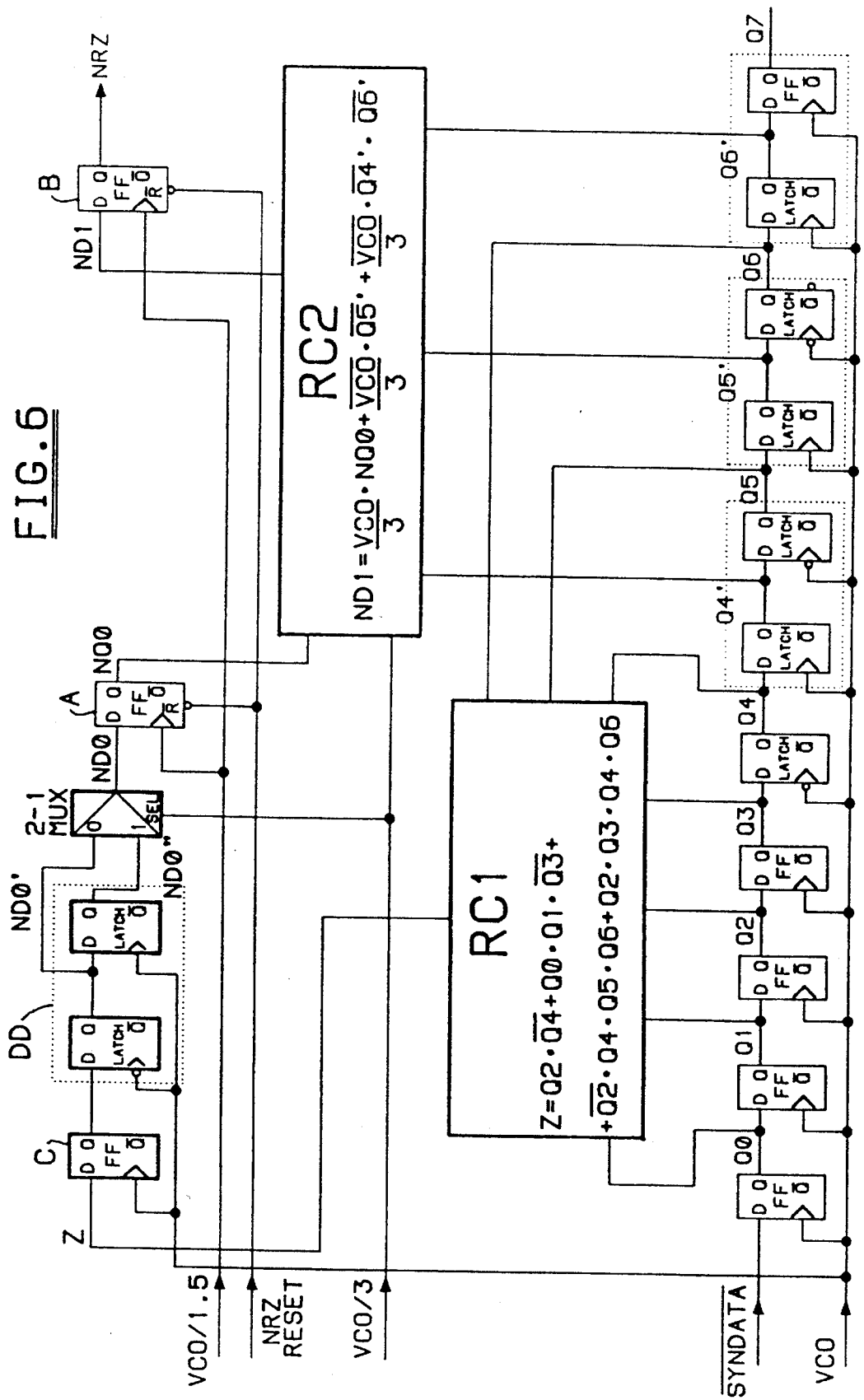
FIG. 6 is a block diagram of a decoder of the invention, according to an alternative embodiment thereof.
Figure 7:
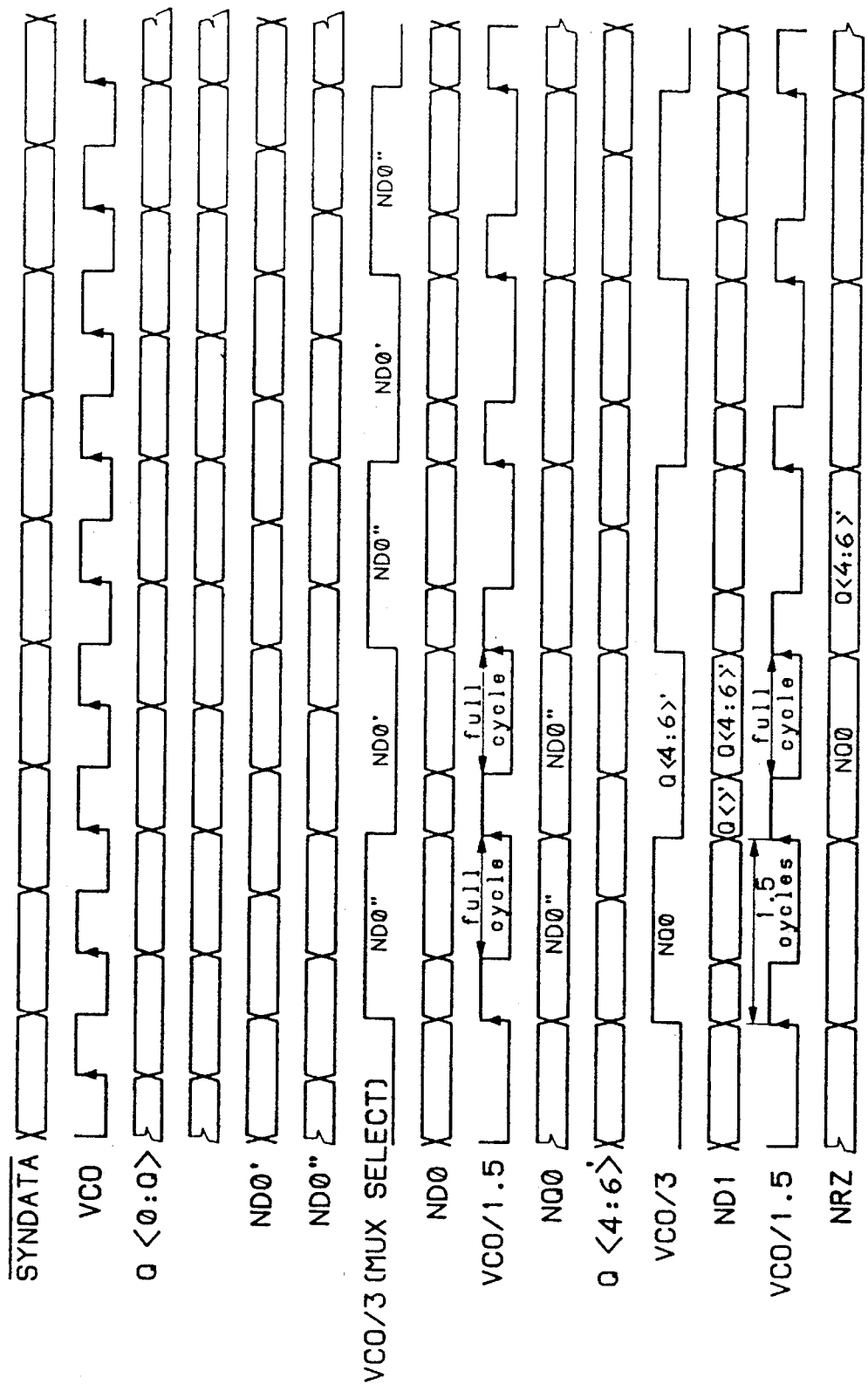
FIG. 7 is a timing diagram of the decoder of FIG. 6.

For an immediate comparison with the prior art described in FIGS. 3 and 4, also the decoders described in the FIGS. 5, 6 and 7, relate to an RLL(1,7) coding, which is widely used in hard-disk read/write channels. Nevertheless, it is clear that the "pipelined" decoder of the present invention, is applicable also to other types of coding that employ fractionary frequency clock signals derived from a base clock signal synchronous with the transitions of an input coded serial signal (the frequency of which as already pointed out above, may vary within certain limits) and wherein the coded input stream has a larger number of bits than the corresponding decoded output stream.

By referring to the functional diagram of FIG. 5 and to the relative timing diagram of FIG. 7, the system of the present invention contemplates that the first combinative logic, decoding network RC1 processes the values of the Q output taps (6:0) of the flip-flops that form the shift register SR, two full cycles of the synchronous clock signal VCO in advance of the processing by the second combinative logic network RC2 of the relative bits. This in order to ensure availability of a corresponding decoded value ND 1 at the input D of the output register B (flip-flop) of the decoded NRZ output, stream, a full cycle of the clock signal VCO, before a raising front of the first frequency clock signal. The first frequency clock signal has a fractionary frequency as compared with the frequency of the base synchronous clock signal VCO, in a frequency ratio congruent with the ratio between the numbers of corresponding bits of the coded input stream and of the decoded output stream, which, in the example shown, is equal to VCO/1.5.

The base clock signal $\overline{\text{VCO}}$, synchronous with the coded input stream $\overline{\text{SYNDATA}}$, controls the shifting of the bits in the register SR, as well as the sampling instants of the three storing latches of the three bits Q4', Q5' and Q6' that are eventually processed by the second combinative logic network RC2. The output value Z of the first combinative logic network RC1 is fed to the D input of a first flip-flop C, which is also sampled by the base clock signal VCO. The output value Q of the flip-flop C is stored in a latch LC beside being also fed to the input D of a second flip-flop DD, both sampled by the same base clock signal VCO. The Q output terminal of the flip-flop DD and the Q output terminal of the latch LC are connected to respective inputs of a selection multiplexer MUX(2-1), controlled by the second fractionary frequency clock signal VCO/3. This second clock signal has a fractionary frequency as compared with the frequency of the base synchronous clock signal VCO. It is also input to the second combinative logic network RC2. In fact, as in a prior art decoder, the second fractionary clock signal VCO/3 is employed for varying the combinative function of the block RC2. Its output may therefore assume alternately the value NQ0, as produced by the first combinative logic network RC1 and synchronized by the flip-flop A, and the value that is produced by the second combinative logic network RC2 by processing the relative bits. In practice, RC2 incorporates a multiplexer, the function of which is necessary in order to alternately output two decoded NRZ bits (i.e. the signal ND 1). They are then sampled at the frequency of the output fractionary clock signal VCO/1.5, in order to produce the output NRZ stream.

The synchronization and multiplexing system of the value Z produced by the first combinative logic network RC1 is such that, at the D input of the first synchronization flip-flop A of the known structure of the decoder, a pre-decoded value ND0 is present (coherently selected between the values ND0' and ND0" by the multiplexer MUX). This happens a full cycle of the base clock signal VCO in advance of the rising from of the output sampling clock signal VCO/1.5. This produces the NQ0 value which is in turn synthesized with the stored bits by the second combinative logic network RC2.

In other words, the anticipated processing by two VCO clock cycles, performed by the first combinative logic network RC1, is completed within a period of time corresponding to a full cycle of the clock VCO. Subsequently the pre-decoded signal is multiplexed and synchronized. This also permits the second combinative logic network RC2 to complete the logic processing of the values of the three stored bits, Q4', Q5' and Q6', of the pre-decoded signal NQ0 and of the second fractionary clock signal VCO/3, within an interval of time corresponding to a full cycle of the VCO clock signal. In the same time, it is satisfied the condition of making available to the D input of the output flip-flop B, the decoded value ND 1, a full cycle of the clock signal VCO in advance of the rising from of the output sampling clock signal VCO/1.5.

In this way, the important result of doubling the operating frequency of the decoder for the same fabrication technology, in other words for the same propagation delays of the two decoding blocks RC1 and RC2, is achieved.

Such an outstanding result is pointed out in the timing diagrams of the circuit, shown in FIG. 7.

The logic functions performed by the decoding blocks are shown in FIG. 5. The additional circuit devices that are required by the circuit of the invention, as compared with the functional devices that are normally required by a decoder made according to the prior art, are evidenced by tracing them with thicker lines than the lines used for tracing the other (conventional) portions of the decoder.

In practice, the novel architecture of the decoder of the invention requires the use of a 2×1 multiplexer, two flip-flops and four latches in addition to the components of a decoder of the prior art.

Moreover, if the flip-flops are of the Master-Slave type, it is possible, according to an alternative embodiment of the decoder of the invention, to reduce the number of additional devices to just only two flip-flops and a 2×1 multiplexer, Such an embodiment is depicted in the circuit diagram of FIG. 6. Instead of employing three additional latches for storing the three bits Q4', Q5' and Q6', according to the functional diagram of FIG. 5, the signals taken directly from the outputs of the Master latches of the relative flip-flops Q4, Q5 and Q6 of the shift register are fed to the respective inputs of the second combinative logic network RC2. Also, the formation of the additional latch LC of the functional diagram of FIG. 5, necessary for storing the output Q of the flip-flop C, may be avoided. In fact, it is possible to connect to the respective input terminal 0 of the multiplexer MUX the Q output terminal of the Master latch of the DD flip-flop which produces the other pre-decoded signal ND0", fed to the other input terminal (1) of the multiplexer MUX.

In this way, it is no longer necessary to integrate four additional latches, thus making outstandingly economical the implementation of the decoder of the invention, which therefore assumes an even greater value in terms of cost/benefits.

What is claimed is:

1. A decoder of a coded serial stream of digital data in a decoded serial stream of digital data, comprising:

a first circuit block for generating a base clock signal, synchronous with the transitions in the coded serial stream;

a second circuit block for deriving from said base clock signal a first fractionary frequency clock signal, having a frequency fractionary with respect to the frequency of said base clock signal and with a frequency ratio congruent with the ratio between the number of bits of said coded serial stream and the number of equivalent bits of said decoded stream, and a second fractionary frequency clock signal having a fractionary frequency with respect to said first fractionary frequency clock signal;

a shift register including a plurality of flip-flops, receiving the input coded serial stream, under control of said synchronous base clock signal;

a first combinative-logic decoding network for processing n bits stored in said shift register and producing a first pre-decoded value;

a first synchronizing flip-flop, sampled by said first fractionary frequency clock signal, receiving said first pre-decoded value;

a second combinative-logic decoding network for combining a fractionary number of said n bits, said first pre-decoded and synchronized value and said second fractionary frequency clock signal, and for producing a second pre-decoded value at an output thereof;

a second output flip-flop, sampled by said first fractionary frequency clock signal, receiving said second decoded value and producing at an output thereof the decoded serial stream;

a third circuit block for anticipating by two cycles of said base clock signal the processing by said first combinative-logic decoding network of said n bits for producing said first pre-decoded value; and a fourth circuit block for storing said fractionary number of said n bits that are processed by said second combinative-logic decoding network;

wherein said third circuit block includes synchronizing and multiplexing circuitry for said first pre-decoded value produced by said first combinative-logic decoding network, including a third flip-flop, receiving said first pre-decoded value and having an output connected to an input of a fourth flip-flop and to an input of a latch, and a multiplexer, two inputs of which, selected by said second fractionary frequency clock signal, are connected to respective outputs of said fourth flip-flop and of said latch, and the output of which is connected to said first synchronization flip-flop; and said third and fourth flip-flops, said latch and said fourth circuit block for storing said bits processed by said second combinative-logic decoding network are sampled by said base clock signal.

2. A decoder according to claim 1, wherein said first and second combinative-logic decoding networks are two level networks, having a first AND level and a second OR level.

3. A decoder according to claim 1, wherein said first and second combinative-logic decoding networks have two NAND levels.

4. A decoder according to claim 1, wherein said fourth flip-flop is of the Master-Slave type.

5. A decoder according to claim 1, wherein said fourth circuit block is functionally substituted by connections to the output node of the Master latch of respective flip-flops of the Master-Slave type in the shift register, the output of which contains the relevant processable bit.

6. A decoder according to claim 1, wherein the coded serial stream is an RLL(x,y) stream.

7. A decoder according to claim 1, capable of handling a number n of bits and wherein said shift register is composed by a number n+K of flip-flops, where K≠0.

8. A decoder according to claim 1, wherein said base clock signal is extracted by the coded serial stream by means of a phase-locked ring circuit cooperating with a voltage controlled oscillator.

9. A decoder for extracting data from a coded serial data stream, comprising:

a shift register for receiving the coded serial data stream, and having a plurality of outputs therefrom;

a first clock signal synchronous with data transitions in the coded serial data stream;

a second clock signal having a frequency less than the first clock signal by a fraction proportional to a ratio between a number of bits in the coded serial data stream and a corresponding number of bits in the data;

a third clock signal having a frequency less than the second clock signal by a fraction proportional to a preselected ratio; a first combinational logic circuit connected to the shift register outputs, such first circuit generating a first pre-decoded value;

a second combinational logic circuit connected to a subset of the shift register outputs, such second circuit generating a second pre-decoded value; and means for synchronizing the outputs from the first and second combinational logic circuits so that such circuits have one entire cycle of the first clock signal to generate their corresponding outputs.

10. The decoder of claim 9, wherein the synchronizing means comprises:

a first clocked delay circuit for providing a delay of two cycles of the first clock signal between generation of the first pre-decoded value and provision of such delayed signal to an input to the second combinational logic circuit;

a second clocked delay circuit connected to the second combinational logic circuit and the shift register for delaying the subset of shift register outputs for one cycle of the first clock signal before providing them to the second combinational logic circuit; and a flip-flop connected to the output of the second combinational logic circuit for providing the output from the decoder.

11. The decoder of claim 9, wherein the synchronizing means comprises:

a first flip-flop connected to the output of the first combinational logic circuit, and clocked by the first clock signal;

a second flip-flop connected to the output of the first flip-flop, and clocked by the first clock signal;

a first latch connected to the output of the first flip-flop, and clocked by the first clock signal;

a multiplexor connected to the outputs of the first latch and the second flip-flop, and having a control input connected to the third clock signal;

a third flip-flop connected to the output of the multiplexor, and clocked by the second clock signal, wherein the output of the multiplexor is connected to an input of the second combinational logic circuit;

a plurality of second latches having outputs connected to the second combinational logic circuit, such latches having inputs connected to the subset of the shift register outputs, and being clocked by the first clock signal; and a fourth flip-flop having an input connected to the output of the second combinational logic circuit, and being clocked by the second clock signal, wherein the output of the fourth flip-flop defines the output of the decoder.

12. The decoder of claim 9, wherein the third clock signal has a frequency equal to one-half the frequency of the second clock signal.

13. A method for doubling the maximum operating frequency of a decoder capable of handling a number n of bits of a coded serial stream of data by converting them in a decoded serial stream of data, for the same propagation delay of the combinative logic decoding networks employed, comprising the steps of:

anticipating by two cycles of a clock signal, synchronous with the coded stream, the processing by a first combinative logic decoding network of n bits of said coded stream of data for producing a first signal;

simultaneously storing a fractionary number of said n bits, to be processed by a second combinative logic decoding network;

synchronizing and multiplexing said first signal produced by said first combinative logic network making it available to the input of a synchronizing flip-flop a full cycle of said synchronous clock signal in advance with respect to the rising front of a first fractionary clock signal sampling said decoded output stream; and synthesizing said first signal, synchronized, multiplexed and re-synchronized, with said stored bits and with a second fractionary clock signal in said second combinative logic network and producing a second signal which is made available at the input of an output sampling flip-flop, a full cycle of said synchronous clock signal in advance with respect to the raising front of said first fractionary clock signal sampling said decoded output stream.

* * * * *